United States Patent
Yoko et al.

(10) Patent No.: US 9,305,892 B2
(45) Date of Patent: Apr. 5, 2016

(54) ADHESIVE FOR ELECTRONIC COMPONENT

(71) Applicants: HENKEL IP & HOLDING GMBH, Duesseldorf (DE); HENKEL JAPAN LIMITED, Tokyo (JP)

(72) Inventors: Sugiura Yoko, Yokohama (JP); Horiguchi Yusuke, Yokohama (JP); Mieko Sano, Yokohama (JP); Gina Hoang, Garden Grove, CA (US)

(73) Assignees: HENKEL AG & CO. KGAA, Duesseldorf (DE); HENKEL IP & HOLDING GMBH, Duesseldorf (DE)

(*) Notice: Subject to any disclaimer, the term of this patent is extended or adjusted under 35 U.S.C. 154(b) by 0 days.

(21) Appl. No.: 14/267,511

(22) Filed: May 1, 2014

(65) Prior Publication Data
US 2014/0242757 A1 Aug. 28, 2014

Related U.S. Application Data

(63) Continuation of application No. PCT/US2012/059961, filed on Oct. 12, 2012.

(60) Provisional application No. 61/554,698, filed on Nov. 2, 2011.

(51) Int. Cl.
| | |
|---|---|
| H01L 21/00 | (2006.01) |
| H01L 23/00 | (2006.01) |
| C09J 133/06 | (2006.01) |
| C09J 133/08 | (2006.01) |
| C09J 201/02 | (2006.01) |
| C09J 4/06 | (2006.01) |
| H01L 21/78 | (2006.01) |
| H05K 1/03 | (2006.01) |
| C09J 151/00 | (2006.01) |

(52) U.S. Cl.
CPC . *H01L 24/29* (2013.01); *C09J 4/06* (2013.01); *C09J 133/06* (2013.01); *C09J 133/08* (2013.01); *C09J 151/003* (2013.01); *C09J 201/02* (2013.01); *H01L 21/78* (2013.01); *H01L 24/83* (2013.01); *H05K 1/0373* (2013.01); *H01L 2224/73104* (2013.01); *H01L 2224/73204* (2013.01); *H01L 2224/838* (2013.01); *H01L 2224/83191* (2013.01); *H01L 2924/12042* (2013.01); *Y10T 428/2848* (2015.01); *Y10T 428/2852* (2015.01)

(58) Field of Classification Search
CPC ....... C09J 123/00; C09J 133/06; H01L 24/29; H01L 21/78; H01L 24/83; H05K 1/0373; Y10T 428/2848
See application file for complete search history.

(56) References Cited

U.S. PATENT DOCUMENTS

| 6,319,603 | B1 * | 11/2001 | Komiya et al. | 428/378 |
| 2007/0123653 | A1 | 5/2007 | Attarwala et al. | |
| 2012/0326301 | A1 * | 12/2012 | Wakioka et al. | 257/737 |
| 2014/0342160 | A1 * | 11/2014 | Zuo et al. | 428/414 |

FOREIGN PATENT DOCUMENTS

| JP | 2006219526 A | 8/2006 |
| KR | 1020100105428 A | 9/2010 |
| WO | 2011090038 A1 | 1/2011 |

* cited by examiner

*Primary Examiner* — Richard Booth
(74) *Attorney, Agent, or Firm* — Steven C. Bauman

(57) ABSTRACT

An adhesive composition for a pre-applied underfill sealant comprising: (a) a radical polymerizable monomer having one or more functional groups selected from the group consisting of vinyl group, maleimide group, acryloyl group, methacryloyl group and allyl group, (b) a polymer having a polar group, (c) a filler, and (d) a thermal radical initiator.

11 Claims, 4 Drawing Sheets

Figure 1
(a)
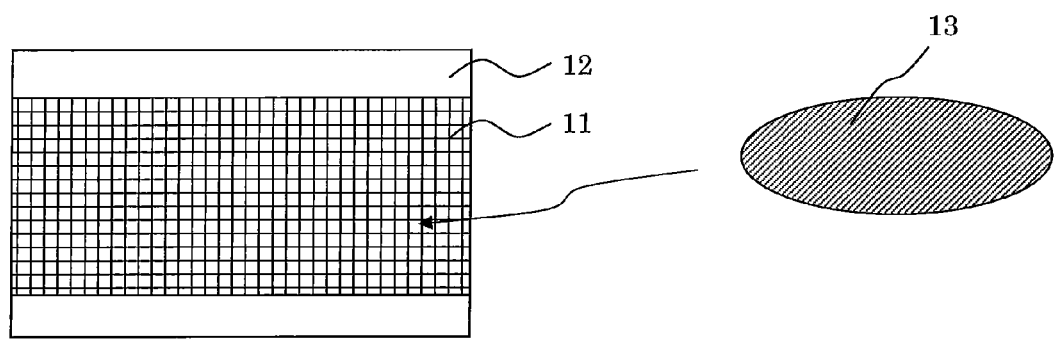
(b)
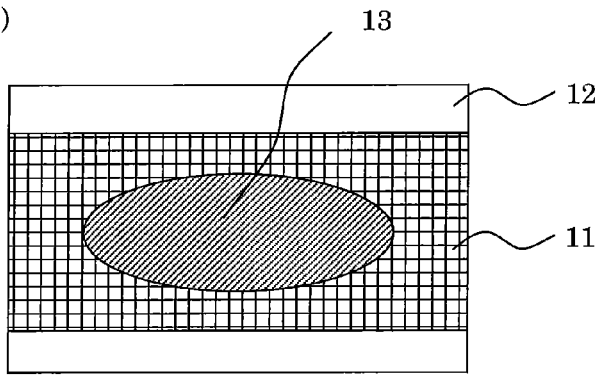
(c)
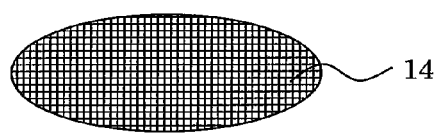

Figure 2
(a) Spin Coating
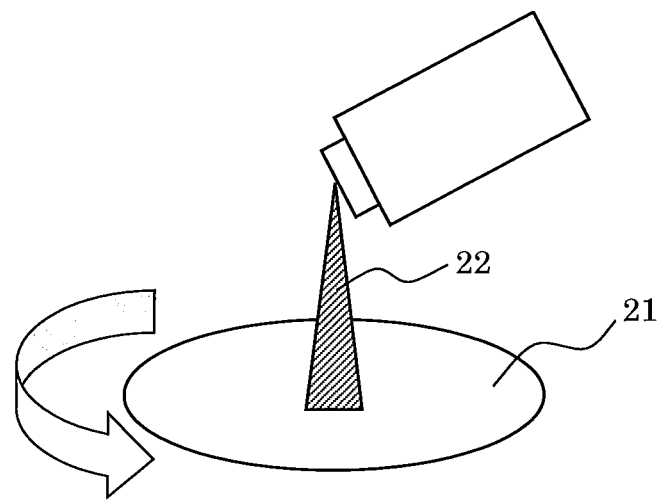
(b) Heating
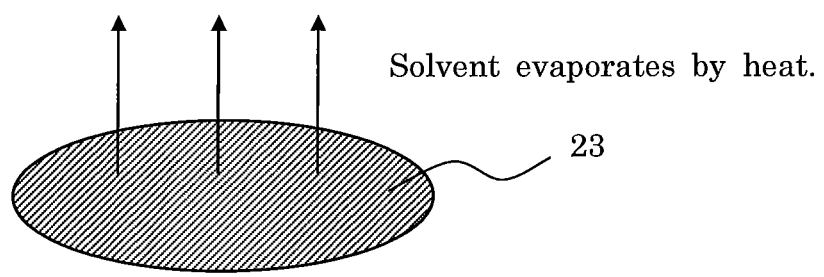
Solvent evaporates by heat.
(c)
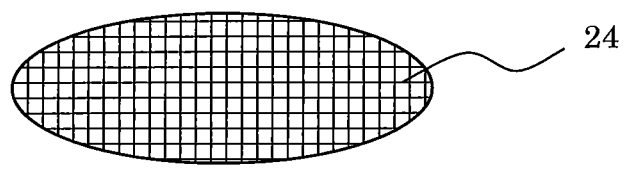

Figure 4
(a)
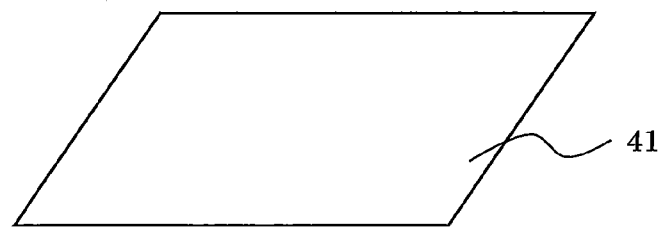
(b) Screen Printing
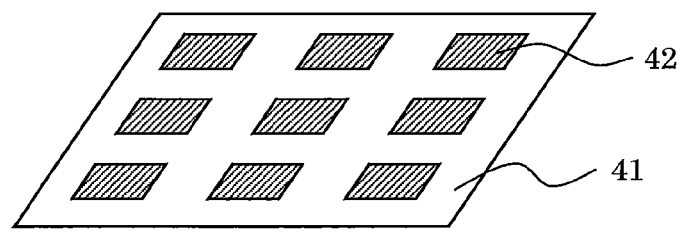
(c) Heating
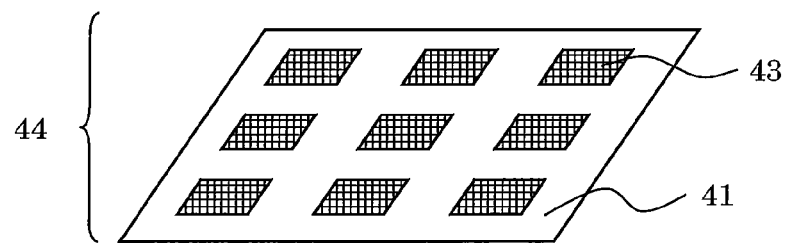

ADHESIVE FOR ELECTRONIC COMPONENT

CROSS-REFERENCE TO RELATED APPLICATION

This application is a continuation of International Patent Application No. PCT/US2012/059961 filed Oct. 12, 2012, which claims priority to U.S. Provisional Patent Application Ser. No. 61/554,698 filed Nov. 2, 2011, the contents of both of which are incorporated herein by reference.

BACKGROUND

The present invention relates to an adhesive composition usable for a pre-applied application in flip chip mounting of semiconductor chips, an electronic component with adhesive layer and an electronic device using the adhesive composition, and a production method thereof.

As a mounting technology of a semiconductor chip, flip chip technology, which directly connects a semiconductor chip on a board, is known. In flip chip mounting, a semiconductor chip is connected to a wiring board through an electrode (bump) formed on the element-formed face (the active circuit face) of a semiconductor chip. An underfill material, which is an adhesive resin composition, is generally filled between the bonding faces for the purpose of reinforcement of bonding sites and improvement in bonding reliability.

Capillary underfilling is known as a method of filling an underfill material. This method comprises the steps of making an electrical connection of a wiring board and an electrode on a chip, applying a liquid resin composition on one or more sides of the chip, and allowing the resin composition to flow into the gap between the wiring board and the chip by capillary action. Upon curing, the underfill material acts as an encapsulant. However, the capillary underfilling system has the disadvantage of requiring more time than optimally feasible for sealing because it is difficult to uniformly inject the resin into the space between fine electrodes in a short time.

To solve this problem, a method is known, wherein an adhesive in the form of a film or paste is placed on a board, subsequently a semiconductor chip is mounted, and electrode bonding and sealing are carried out at the same time. This method requires a step of providing an adhesive on a board in the production of an electronic device.

From a viewpoint of further foreshortening the mounting process, a method using the pre-applied underfill sealant (PAUF) is known. This method is characterized in using an electronic component equipped with a B-staged adhesive composition beforehand in producing an electronic device. B-staged means that any solvent in the adhesive composition is evaporated off and/or the adhesive partially cured, so that the adhesive composition is not tacky. For instance, a wafer with an adhesive layer is used, which has a B-staged adhesive composition on one face of the wafer beforehand. Then, the wafer with the adhesive layer is separated into semiconductor chips by dicing, and a separated semiconductor chip is mounted and bonded on a board to produce an electronic device. Alternatively, an electronic device may be produced by using a wiring board equipped with a B-staged adhesive composition. This method facilitates an increase in the UPH (i.e. unit per hour: production volume per hour) for manufacturers of wiring boards because the step of applying a resin composition onto the wiring board can be omitted in producing an electronic device. Also, when semiconductor chips are multistacked, using the pre-applied underfill sealant has merit since it is easy to handle; for example, there is no need for a step of applying the adhesive and no operational variation in the applied adhesive.

As an adhesive for underfill, adhesives comprising an epoxy resin have been known. A wide variety of epoxy resins have been developed and used because the adhesives comprising the epoxy resin have an advantage in high adhesiveness for various substrates, and excellent mechanical strength and insulation.

However, an adhesive containing an epoxy resin has a short pot life due to the gradual progression of a curing reaction. For this reason, an electronic component equipped with an adhesive containing an epoxy resin as a pre-applied underfill sealant is not suitable for a method undergoing several steps afterward for producing a semiconductor. There are also many problems on setting a condition for a mounting process in the flip chip technique. For example, using an adhesive comprising an epoxy resin requires a long time for thermal compression bonding because an epoxy resin needs a long curing time, and it is difficult to control a temperature in each step of mounting because heat of the reaction is high. Furthermore, an adhesive containing an epoxy resin has a high concentration of chlorine derived from the production of source materials, which may corrode the metal in use for an electronic material.

SUMMARY OF THE INVENTION

The present invention provides an adhesive composition that solves the problems in using the conventional adhesives described above, and that increases productivity of an electronic device. Furthermore, the present invention provides an electronic component with an adhesive layer produced by using the adhesive composition, an electronic device produced by using the electronic component, and a production method thereof.

The present invention relates to an adhesive composition for a pre-applied underfill sealant comprising (a) a radical polymerizable monomer having one or more functional groups selected from the group consisting of vinyl group, maleimide group, acryloyl group, methacryloyl group and allyl group; (b) a polymer having a polar group, (c) a filler, and (d) a thermal radical initiator.

In one embodiment, the polar group on the polymer having a polar group is selected from the group consisting of hydroxyl group, carboxyl group, (meth)acryloyl group and epoxy group. In another embodiment, the polar group has a weight-average molecular weight in the range of 10,000 to 1,000,000.

Typically the filler has an average particle diameter of less than 1 μm.

In another embodiment, the radical initiator is an organic peroxide.

The adhesive composition can be in the form of a liquid or in the form of a film. When in the form of a film, the adhesive composition can be laminated to a support tape, after which the adhesive composition will be B-staged. B-staging refers to heating the adhesive composition to the extent that the respective constituents contained in the composition do not proactively initiate a reaction (cure), but, the adhesive composition is rendered dry, that is, non-tacky, by volatilizing any solvent. In other cases, B-staging an adhesive to a non-tacky state is accomplished by a partial curing or setting up.

In one embodiment, the back side of the wafer is thinned; this is usually accomplished by grinding or lasering away excess thickness.

In further embodiments, this invention is a method for producing a wafer with an adhesive layer, comprising a step of applying the liquid adhesive composition onto an element-formed face of the wafer, and B-staging the applied adhesive composition. Alternatively, when the adhesive composition is in the form of a film, the method will comprise a step of laminating the film-formed adhesive onto the element-formed face of the wafer.

In other embodiments, this invention is a wiring board with the adhesive composition disclosed above in a B-staged state laminated on the wiring board; an electronic device produced by using the above described adhesive composition; and an electronic device produced by using the wafer with the above described adhesive composition.

In further embodiments, this invention is a method for producing an electronic device, comprising the steps of dicing the wafer with the adhesive composition to separate the wafer into semiconductor chips; placing the separated semiconductor chip on a wiring board so that a circuit face of the wiring board and the adhesive layer of the semiconductor chip are face-to-face; and carrying out thermal compression bonding to make an electrical connection. In a further embodiment, the back side of the wafer is thinned before the dicing step.

In another embodiment, this invention is a method for producing an electronic device comprising the steps of: thinning the backside of a wafer having the adhesive layer described above, dicing the thinned wafer with the adhesive layer to separate the wafer into semiconductor chips; placing a separated semiconductor chip on a wiring board so that a circuit face of the wiring board and the adhesive layer of the semiconductor chip are face-to-face, and carrying out thermal compression bonding to make an electrical connection.

Alternatively, the method for producing an electronic device comprises the steps of: placing a semiconductor chip on the wiring board with the above described adhesive composition so that a circuit face of the wiring board and an element-formed face of the semiconductor chip are face-to-face; and carrying out thermal compression bonding to make an electrical connection.

In accordance with the present invention, an adhesive composition can be obtained, which solves the problems of underfill sealants containing the conventional epoxy resins. In particular, the adhesive composition of the present invention is suitable for pre-applied underfill sealant because the composition has a longer pot life and a shorter curing time in comparison with the conventional underfill sealants, and also has sufficient adhesion for use as an underfill sealant. Furthermore, the present invention can increase the efficiency in production of an electronic device by flip chip mounting.

BRIEF DESCRIPTION OF THE DRAWINGS

FIG. 1(a)-1(c) shows one example of the method for producing a wafer with an adhesive layer by using the film-shaped adhesive composition of the present invention.

FIG. 2(a)-2(c) shows one example of the method for producing a wafer with an adhesive layer by using the liquid adhesive composition of the present invention.

FIG. 4(a)-4(c) shows one example of the method for producing a wiring board with an adhesive by using the adhesive composition of the present invention.

DETAILED DESCRIPTION OF THE INVENTION

Figure 3:
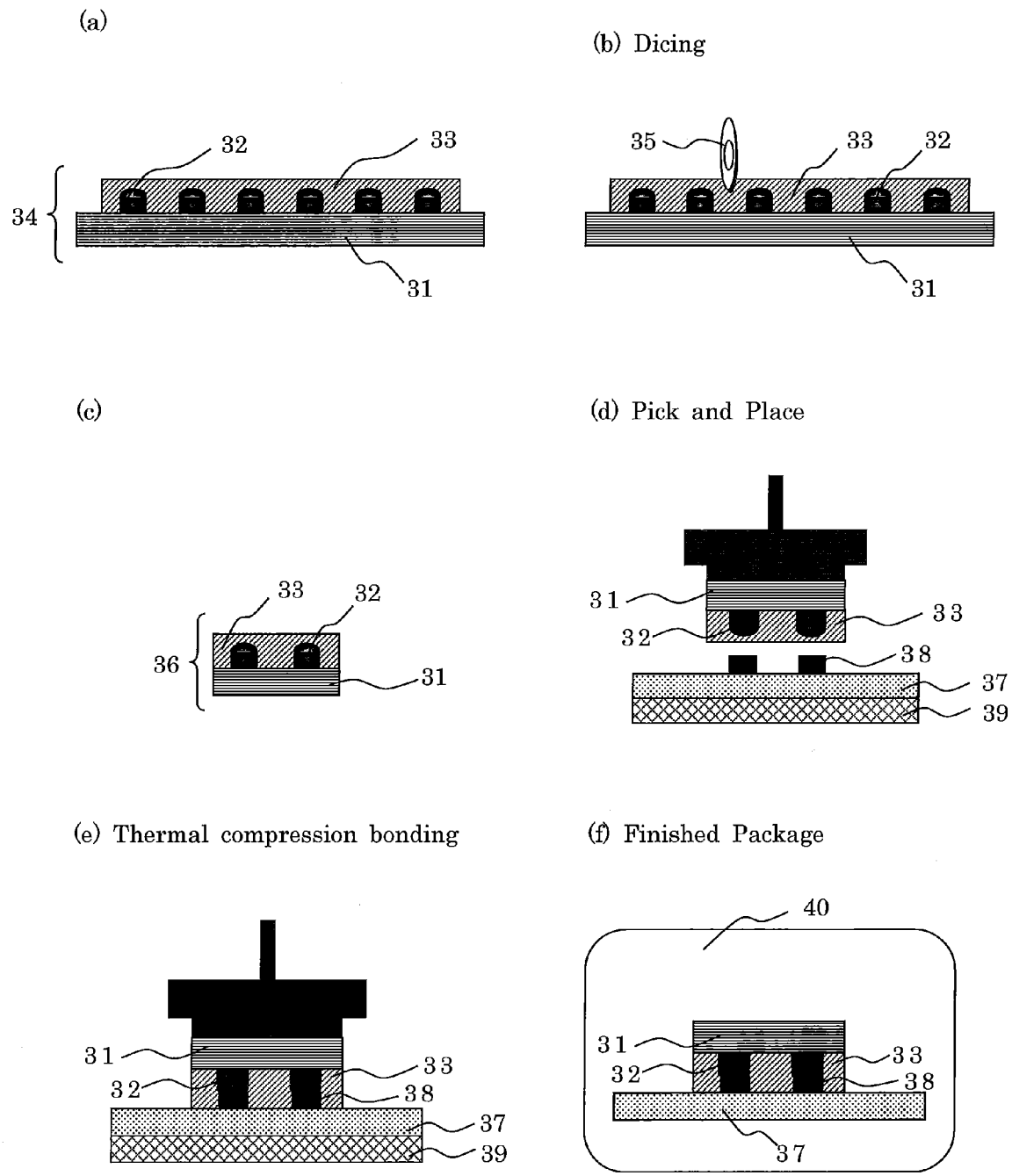
FIG. 3(a)-3(f) shows one example of the method for producing the electronic device of the present invention.

The adhesive composition of the present invention can be B-staged and used as a pre-applied underfill sealant in the flip chip technique. The adhesive composition of the present invention has a short curing time, a high elastic modulus, a low linear expansion coefficient, a high die shear strength and suppressed generation of voids.

The present invention is characterized in that the adhesive composition is used for pre-applied application in producing an electronic component and comprises at least, (a) a radical polymerizable monomer, (b) a polymer having a polar group, (c) a filler, and (d) a thermal radical initiator. Hereinafter, each component will be explained.

Radical Polymerizable Monomer (a).

The radical polymerizable monomer contained in the adhesive composition of the present invention has one or more functional groups selected from the group consisting of vinyl group, maleimide group, acryloyl group, methacryloyl group and allyl group. While the number of functional groups per the radical polymerizable monomer is not limited particularly, a bifunctional radical polymerizable monomer may be preferably used. The radical polymerizable monomer may be used alone or in combination of two or more monomers. In addition to a bifunctional radical polymerizable monomer, a monofunctional radical polymerizable monomer and/or a radical polymerizable monomer having three or more functional groups may be used as necessary. For example, the adhesive composition of the present invention preferably comprises 50% or more, more preferably 60% or more, further preferably 70% or more of a bifunctional radical polymerizable monomer, and as necessary a radical polymerizable monomer having three or more functional groups and/or a monofunctional radical polymerizable monomer.

While the amount of a radical polymerizable monomer may be arbitrarily adjusted depending on other compounds contained in the adhesive composition, production conditions, and end use applications of the adhesive composition, for example, it is preferably 1 to 50% by weight, more preferably 5 to 30% by weight based on the total weight of the adhesive composition. When the amount of a radical polymerizable monomer is too low, the elastic modulus of the adhesive after curing likely becomes too low, and the adhesiveness likely becomes too low.

The radical polymerizable monomer used in the present invention may include, but is not limited to, for example, the following compounds.

Exemplary compounds having a monofunctional (meth) acryloyl group include phenylphenol acrylate, methoxypolyethylene acrylate, acryloyloxyethyl succinate, fatty acid acrylate, methacryloyloxyethylphthalic acid, phenoxyethylene glycol methacrylate, fatty acid methacrylate, β-carboxyethyl acrylate, isobornyl acrylate, isobutyl acrylate, t-butyl acrylate, hydroxyethyl acrylate, hydroxypropyl acrylate, dihydrocyclopentadiethyl acrylate, cyclohexyl methacrylate, t-butyl methacrylate, dimethylaminoethyl methacrylate, diethylaminoethyl methacrylate, t-butylaminoethyl methacrylate, 4-hydroxybutyl acrylate, tetrahydrofurfuryl acrylate, benzyl acrylate, ethylcarbitol acrylate, phenoxyethyl acrylate, methoxytriethylene glycol acrylate.

Exemplary compounds having two or more (meth)acryloyl groups include hexanediol dimethacrylate, hydroxyacryloyloxypropyl methacrylate, hexanediol diacrylate, urethane acrylate, epoxyacrylate, bisphenol A-type epoxyacrylate, modified epoxyacrylate, fatty acid-modified epoxyacrylate, amine-modified bisphenol A-type epoxyacrylate, allyl methacrylate, ethylene glycol dimethacrylate, diethylene glycol dimethacrylate, ethoxylated bisphenol A dimethacrylate, tricyclodecanedimethanol dimethacrylate, glycerin dimethacrylate, polypropylene glycol diacrylate, propoxylated ethoxylated bisphenol A diacrylate, 9,9-bis(4-(2-acryloyloxyethoxy)phenyl) fluorene, tricyclodecane diacrylate, dipropylene glycol diacrylate, polypropylene glycol diacrylate, PO-modified neopentyl glycol diacrylate, tricyclodecanedimethanol diacrylate, 1,12-dodecanediol dimethacrylate, trimethylolpropane trimethacrylate, dipentaerythritol polyacrylate, dipentaerythritol hexaacrylate, trimethylolpropane triacrylate, trimethylolpropane ethoxy triacrylate, polyether triacrylate, glycerin propoxy triacrylate, pentaerythritol tetraacrylate, pentaerythritolethoxy tetraacrylate, ditrimethylolpropane tetraacrylate, monopentaerythritol acrylate, dipentaerythritol acrylate, tripentaerythritol acrylate, polypentaerythritol acrylate.

A compound having an allyl group is allyl glycidyl ether.

A compound having a vinyl group is vinylformamide,

Exemplary compounds having maleimide group include 4,4'-diphenyl-methanebismaleimide, m-phenylenebismaleimide, bisphenol A diphenyl ether bismaleimide, 3,3'-dimethyl-5,5'-diethyl-4,4'-diphenylmethanebismaleimide, 4-methyl-1,3-phenylenebismaleimide, 1,6'-bismaleimide-(2,2,4-trimethyl)hexane and the like.

Among these, particularly preferably, a monomer having two or more acryloyl groups and/or methacryloyl groups is contained in the adhesive composition.

Polymer Having a Polar Group (b).

The polymer having a polar group contained in the adhesive composition of the present invention has a function to increase a viscosity and to assist supporting the shape of the adhesive composition. That is to say, when the adhesive composition is in a liquid state, the polymer serves to render adequate viscosity to the adhesive composition so that the applied liquid does not drip, or when the adhesive composition has a film shape, the polymer serves to maintain its film shape.

The polymer having a polar group includes, without a particular limitation, phenoxy resins, polyester resins, polyurethane resins, polyimide resins, siloxane-modified polyimide resins, polybutadiene, polypropylene, styrene-butadiene-styrene copolymer, styrene-ethylene-butylene-styrene copolymer, polyacetal resins, polyvinylbutyral resin, polyvinylacetal resin, polyamide resins, acrylonitrile-butadiene copolymer, acrylonitrile-butadiene-acrylic acid copolymer, acrylonitrile-butadiene-styrene copolymer, polyvinyl acetate, nylon, (meth)acrylic resins, (meth)acrylic rubbers, urethane(meth)acrylate polymers, acrylic copolymers and modified polymers thereof. These polymers intrinsically have a polar group, a polar group introduced by copolymerization, or a polar group introduced into a polymer by polymer modification.

In particular embodiments, the resins are selected from the group consisting of (meth)acrylic resins, (meth)acrylic rubbers, urethane(meth)acrylate polymers and acrylic copolymers, which are individually synthesized from starting material-monomers including at least one monomer selected from alkyl(meth)acrylates and (meth)acrylic acids such as butyl acrylate, ethyl acrylate, ethyl methacrylate, 2-ethylhexyl acrylate, methacrylic acid, isobutyl methacrylate and butyl methacrylate.

In particular embodiments, the polar group in the above-described polymer, without particular limitation, is selected from the group consisting of hydroxyl group, carboxyl group, epoxy group and (meth)acryloyl group. These polar groups serve as an electrostatic or chemical crosslink, which exerts a good effect between the resins and on an adhered object.

For example, when the polymer is (meth)acrylic resin, (meth)acrylic rubber, urethane(meth)acrylate polymer or acrylic copolymer synthesized with an alkyl(meth)acrylate and/or (meth)acrylic acid as at least one monomer of starting materials, the polar groups can be introduced into the polymer, for example, by copolymerizing alkyl(meth)acrylate together with a monomer, for example, (meth)acrylic acid, hydroxyalkyl(meth)acrylate such as hydroxyethyl(meth) acrylate, and epoxy group-containing (meth)acrylate such as glycidyl(meth)acrylate. (Meth)acryloyl group can be introduced by a side-chain reaction on poly(meth)acrylate in which a functional group has been introduced by copolymerization.

An amount of the above-described polar group introduced in the polymer is not limited in particular. For example, when the polar group is (meth)acryloyl group, the number of units having (meth)acryloyl group to the total number of all units is preferably 5% or more and less than 30%. When the polar group is carboxyl group, an acid number is preferably not less than 3 mgKOH/g and not more than 50 mgKOH/g. When the polar group is hydroxyl group, a base number is preferably not less than 3 mgKOH/g and not more than 50 mgKOH/g. When the polar group is epoxy group, an epoxy value is, for example, preferably not less than 0.15 eq/kg and not more than 0.30 eq/kg. When an introduction rate of the polar group is within said range, the adhesive composition is easy to handle because gelation or viscosity increase of the adhesive composition does not occur, and even after curing the adhesive composition, there is no problem such as an adverse effect on an adhered object or a reduced elastic modulus of an adhesive.

A weight-average molecular weight of the polymer having a polar group to be used in the present invention is, but is not limited to, in the range of 10,000 to 1,000,000. When a weight-average molecular weight of the polymer is within the above-described range, the effects of the addition of the polymer can be sufficiently obtained, and the polymer can be readily mixed with other constituents without any viscosity problem.

An amount of the polymer having the above-described polar group is, but is not limited to, preferably 1 to 30% by weight, more preferably 1 to 20% by weight to the total weight of the adhesive composition. When an amount of the polymer is within the above-described range, the effects of the addition of the polymer can be sufficiently obtained, the polymer can be readily mixed with other constituents without problem of a viscosity, and an excellent elastic modulus and adhesion after curing the adhesive composition can be obtained.

The polymer having the polar group includes, but is not limited to, for example, commercially-available products such as Paracron series and Art-Resin series made by Negami Chemical Industrial Co., Ltd., Arufon series made by Toagosei Co., Ltd., Teisan resin series made by Nagase ChemteX Co., and phenoxy resin YP series and their specialty grade made by Nippon Steel Chemical Co., Ltd.

An acrylic resin having a polar group in which a rubber particle has been dispersed beforehand may also be used. This has excellent miscibility with other components such as a radical polymerizable monomer, in particular, a compound having (meth)acryloyl group.

Filler (c).

The adhesive composition of the present invention comprises a filler. By comprising a filler, an adhesive having a low coefficient of linear expansion and an excellent dimensional stability, and improved flame retardancy, can be obtained. As the filler, an insulating inorganic filler or a conductive inorganic filler may be selected depending on the end use application of the adhesive composition. An insulating inorganic filler includes silicon dioxide, calcium silicate, aluminum hydroxide, magnesium hydroxide, calcium carbonate, magnesium carbonate, magnesium oxide, aluminum nitride, boron nitride and the like, and particularly preferably silicon dioxide. A conductive inorganic filler is, for example, metal or carbon black.

A filler on which a surface modification has been conducted as necessary may also be used. Commercially-available products includes, for example, "Mitsubishi Carbon Black" lineup made by Mitsubishi Chemical Co., "Asahi" series made by Asahi Carbon Co., Ltd., calcium silicate "PCM Light" series, aluminum hydroxide "ALH" series and alumina-based "Celasule" made by Kawai Lime Industry Co., Ltd., titanium oxide "STR series," silicon dioxide "Sciqus series," zinc oxide "FINEEX series," magnesium oxide "SMO series" and zirconium oxide "STR series" made by Sakai Chemical Industry Co., Ltd., silicon dioxide and alumina "Admafine" series made by Admatechs Co., Ltd., silicon dioxide "Snowtex" series made by Nissan Chemical Industries, Ltd., silicon dioxide and aluminum oxide-containing metal oxides "NanoTek" series made by C.I. Kasei Co., Ltd. and the like.

An average particle diameter of the filler to be used in the present invention is preferably smaller than a gap size between an element-formed face of an IC chip and a wiring board in an electronic device finally produced. If the average particle diameter of the filler is too large, a filler may get stuck between metal connections during production of an electronic device, leading to a loss of good electrical reliability.

When the B-staged adhesive composition of the present invention is applied on the alignment mark (i.e. a mark to align a device and a wafer or a board) of a wafer or a board, transparency of an adhesive composition is also required to optically recognize an alignment. When transparency of an adhesive composition is required, the average particle diameter of the filler is preferably less than 1 μm, because the transparency of an adhesive composition degrades if the average particle diameter of the filler is too large.

While an amount of a filler can be adjusted depending on an application, for example, in particular embodiments it is 10 to 80% by weight, and in other embodiments 30 to 70% by weight to the total weight of an adhesive composition. If an amount of a filler is within the above-described range, the effects of the filler can be sufficiently obtained and an adhesive composition has a viscosity without problem of handling.

Thermal Radical Initiator (d).

A thermal radical initiator to be used in the present invention is selected from the compounds that generate a radical at an adequate temperature; an organic peroxide is preferable. In the present invention, the temperature at which the half-life of a thermal radical initiator becomes 1 minute is preferably higher than the temperature at which an adhesive composition is B-staged, and is lower than the temperature at which thermal compression bonding is carried out in the flip chip technique. Specifically, the temperature at which the half-life of a thermal radical initiator becomes 1 minute is preferably within a range, for example, from 80 to 300° C.

The thermal radical initiator includes, without any particular limitation, for example, diisobutyl peroxide, cumyl peroxyneodecanoate, di-n-propyl peroxycarbonate, diisopropyl peroxycarbonate, di-sec-butyl peroxycarbonate, 1,1,3,3-tetramethylbutyl peroxyneodecanoate, di(4-t-butylcyclohexyl) peroxydicarbonate, di(2-ethylhexyl) peroxydicarbonate, t-hexyl peroxy-neodecanoate, t-butyl peroxyneodecanoate, t-butyl peroxyneoheptanoate, t-hexyl peroxypivalate, t-butyl peroxypivalate, di(3,5,5-trimethylhexanoyl) peroxide, dilauroyl peroxide, 1,1,3,3-tetramethylbutylperoxy-2-ethylhexanoate, disuccinic acid peroxide, 2,5-dimethyl-2,5-di(2-ethylhexanoylperoxy)hexane, t-hexylperoxy-2-ethylhexanoate, di(4-methylbenzoyl) peroxide, t-butylperoxy-2-ethylhexanoate, dibenzoyl peroxide, 1,1-di(t-butylperoxy)-2-methylcyclohexane, 1,1-di(t-hexyl-peroxy)-3,3,5-trimethylcyclohexane, 1,1-di(t-hexylperoxy)-cyclohexane, 1,1-di(t-butylperoxy)cyclohexane, 2,2-di(4,4-di-(t-butylperoxy)-cyclohexyl)propane, t-hexylperoxyisopropyl monocarbonate, t-butylperoxymaleic acid, t-butylperoxy-3,5,5-trimethyl hexanoate, t-butylperoxy laurate, t-butylperoxy-isopropyl monocarbonate, t-butylperoxy 2-ethylhexyl monocarbonate, t-hexyl peroxy-benzoate, 2,5-di-methyl-2,5-di(benzoylperoxy)hexane, t-butyl peroxyacetate, 2,2-di(t-butylperoxy)butane, t-butyl peroxybenzoate, n-butyl-4,4-di-(t-butylperoxy)-valerate, di(2-t-butylperoxyisopropyl) benzene, dicumyl peroxide, di-t-hexyl peroxide, 2,5-dimethyl-2,5-di(t-butylperoxy)hexane-3, t-butylcumyl peroxide, di-t-butyl peroxide, p-menthane hydroperoxide, 2,5-dimethyl-2,5-di(t-butylperoxy)hexane, 3,5-diisopropylbenzene hydroperoxide, 1,1,3,3-tetramethylbutyl hydroperoxide, cumene hydroperoxide, t-butyl hydroperoxide, 2,3-dimethyl-2,3-diphenylbutane and the like. These organic peroxides are available for purchase from Akzo Nobel N.V., GEO Specialty Chemicals, Inc., Arkema Inc., NOF Co., Kayaku Akzo Co., Ltd. and the like. These may be used solely or in a combination with two or more ones.

An amount of the thermal radical initiator is preferably 0.01 to 10% by weight, more preferably 0.1 to 5% by weight to the total weight of an adhesive composition. When the amount of the thermal radical initiator is within the above-described range, there is no problem in stability of reactants when an adhesive composition is B-staged, and there is also no need for long time for curing period.

Other Components (e).

Besides the above-described constituents, the adhesive composition of the present invention may comprise an additive such as silane coupling agent, rubber content, antioxidant, light resistant stabilizer, radical stabilizer and surfactant as necessary. By adding silane coupling agent and rubber content to the adhesive composition, the adhesiveness of the adhesive may be increased, and an advantage such as stress relaxation and less warpage of a cured reactant may be obtained. Antioxidant and radical stabilizer may also be used when a further prolonged pot life is needed. Surfactant may be added as a deforming agent and it can improve wettability and leveling ability.

By blending a silane coupling agent into an adhesive composition, the adhesiveness of the adhesive is improved.

A silane coupling agent includes, but is not limited to, for example, aminosilane coupling agent, epoxysilane coupling agent, ureidosilane coupling agent, isocyanatesilane coupling agent, vinylsilane coupling agent, acrylsilan coupling agent, ketiminesilane coupling agent and the like; and preferably isocyanatesilane coupling agent, acrylsilane coupling agent and epoxysilane coupling agent. These silane coupling agents are purchasable from Dow Corning Toray Co., Ltd., Shin-Etsu Chemical Co., Ltd., Matsumoto Fine Chemical Co., Ltd., Tokyo Chemical Industry Co., Ltd. and the like.

While an amount of a silane coupling agent is arbitrarily adjustable, it is, for example, preferably 0 to 10% by weight, more preferably 0 to 5% by weight to the total weight of an adhesive composition. When the amount of a silane coupling agent is too much, voids occur by vaporization of a silane coupling agent in thermal compression bonding in the flip chip technique.

By blending rubber in an adhesive composition, an advantage such as stress relaxation of adhesive and less warpage can be obtained when an adhesive composition is shaped into a film.

Rubber component includes, but is not limited to, for example, rubber products such as acrylic rubber, nitrile rubber, butadiene rubber and nitrilebutadiene rubber, and cross-linkers with low molecular weight for rubber. The commercial products of rubber products include, for example, "Paracron RP" series made by Negami Chemical Industrial Co., Ltd., "Staphyloid IM" series and "Staphyloid AC" series made by GANZ Chemical Co., Ltd., "ZEON" series made by ZEON Kasei Co., Ltd., "Metablen C/E/W/S/SX/SRX" made by Mitsubishi Rayon Co., Ltd. The commercial products of cross-linkers with low molecular weight for rubber include, for example, "Ricon" series made by SARTOMER Co., "poly bd", "poly ip" series, "EPOL" series, "KRASOL" made by Idemitsu Kosan Co., Ltd., "NISSO-PB" made by Nippon Soda Co., Ltd. and the like. These may be used solely or in a combination with two or more ones.

A commercial product of an acrylic resin in which a rubber particle has been dispersed beforehand, may also be used, including, for example, Paracron SN-50, AS-3000, ME-2000, W-1163, W-248E, W-197C, Precoat 200, Panlon S-2012 made by Negami Chemical Industrial Co., Ltd. These rubber components and resins in which rubber particles have been dispersed beforehand may be used as rubber or as polymer in the adhesive composition of the present invention.

While the amount of rubber is arbitrarily adjustable, it is, for example, preferably 0 to 30% by weight, more preferably 0 to 20% by weight to the total weight of an adhesive composition. When the blending amount of rubber is too high, the adhesive composition is not easy to handle and is less miscible with other constituents due to too large an increase in viscosity; consequently, the adhesiveness of the composition is low.

An antioxidant and a radical stabilizer include, for example, hydroquinones, benzoquinones and hindered phenols; and a light resistant stabilizer includes benzotriazole-based, triazine-based, benzophenone-based, benzoate-based, hindered amine-based ultraviolet absorbers and the like. A surfactant may be selected from a catalog available commercially depending on a purpose.

Method for Producing the Adhesive Composition Before B-Staging.

A desired adhesive composition may be produced by, but is not limited to, homogeneously kneading respective constituents in predetermined amounts by means of known various kneading machines such as a homodisperser, a universal mixer, the Banbury mixer, a kneader, double rolls, triple rolls and a extruder, which may be used alone or in combination. The kneading is conducted under room temperature or heating temperature, under normal pressure, reduced pressure, or increased pressure, and/or not under an inert gas flow.

Form of the Adhesive Composition.

The adhesive composition of the present invention may be in the form of a film or a liquid depending on an application thereof.

Film-Shaped Adhesive Composition.

The adhesive composition of the present invention may be a film in which the composition has been B-staged. The thickness of the film-shaped adhesive composition of the present invention is preferably determined by the spacial volume between objects to be bonded. When the thickness of the film-shaped adhesive is too thick, it may be difficult to fulfill a demand of downsizing an electronic device, and a device may be soiled with extruded composition that is elevated to an upper face of a bonded object. When the thickness of the film adhesive is too thin, a bonding strength may be extremely low and the effect of stress relaxation as an underfill sealant may become insufficient due to insufficient fill-out with the adhesive between bonded objects. The thickness of the film-shaped adhesive composition is, without a particular limitation, preferably not less than 5 μm and not more than 100 μm. Here, in the present invention, B-staging is referred to as heating the adhesive composition up to the extent that the respective constituents contained in the composition do not proactively initiate a reaction, consequently, the adhesive composition is rendered dry, that is, non-tacky by volatilizing any solvent. In other cases, B-staging an adhesive to a non-tacky state is accomplished by a partial curing or setting up.

A method for producing the film-shaped adhesive composition of the present invention, for example, comprises the steps of: dissolving or dispersing in a solvent the above-mentioned adhesive composition of the present invention, and applying it on a supporting substrate; and B-staging the adhesive composition by heating to remove the solvent.

The above-described supporting substrate may include, but is not limited to, a plastic film and the like such as a polyethylene terephthalate film, a polytetrafluoroethylene film, a polyethylene film, a polypropylene film and a polymethylpentene film.

The above-described solvent is, but is not limited to, determined preferably with consideration including volatility on B-staging in reference to a boiling point. Specific example preferably includes a solvent having relatively low boiling point such as methanol, ethanol, 2-methoxyethanol, 2-ethoxyethanol, 2-butoxyethanol, methyl ethyl ketone, acetone, methyl isobutyl ketone, toluene and xylene because use of the solvent can prevent progress of curing in the adhesive layer on B-staging. For the purpose of improving coating efficiency, a solvent having relatively high boiling point may be also used such as dimethylacetamide, dimethylformamide, N-methylpyrrolidone and cyclohexanone. These solvents may be used solely or in a combination of two or more solvents.

A method for applying an adhesive composition on a supporting substrate may be carried out by using a commercially-available applicator and the like, including a commonly-known process such as, for example, a knife coating process, a roll coating process, a spray coating process, a gravure coating process, a bar coating process and a curtain coating process.

While conditions for B-staging may be arbitrarily adjusted depending on the composition and thickness of the film to be produced, solvent and the like, the temperature of vaporizing the solvent is preferably from 70° to 150° C., in another embodiment from 90° to 130° C., and, for example, for 0.5 minutes to 10 minutes. B-staging may be carried out by keeping the composition in a static drying oven for a certain time, or by placing it in an in-line oven, a conveyor-type furnace, or the like. As necessary, stepwise heating, temperature increasing with a constant rate, temperature decreasing with a constant rate, and the like may be employed.

The film-shaped adhesive composition of the present invention is preferably provided in a state of lamination with the above-mentioned supporting substrate. Furthermore, the film-shaped adhesive composition of the present invention may also be laminated with another layer such as a backgrinding tape and a protection film.

A backgrinding tape is a tape to support and protect a wafer during a thinning operation, such as backgrinding. Backgrinding is to grind an opposite side (i.e. back side) of an element-formed face of a wafer in the production of an electronic device for the purpose of thinning the device. In the present invention, the above-mentioned supporting substrate may be a backgrinding tape. Alternatively, a backgrinding tape may be provided in a state of lamination in the order of "supporting substrate/film-shaped adhesive composition/backgrinding tape". The lamination of a backgrinding tape allows for protecting an adhesive surface, and the film-shaped adhesive composition on which the backgrinding tape has been laminated beforehand facilitates further-increased efficiency of producing an electronic device.

The film-shaped adhesive composition of the present invention may be laminated with a protection film other than a backgrinding tape, and this protection film may be the above-mentioned supporting substrate. "The supporting substrate/film-shaped adhesive composition/protection film" may also be laminated in that order.

Liquid Adhesive Composition.

The liquid adhesive composition of the present invention may be obtained by homogeneously mixing into a solvent respective constituents comprised in the above-mentioned adhesive composition. The liquid adhesive composition may be controlled when used so that the viscosity thereof allows for applying by an applicator such as a dispenser. The adhesive composition may even be solvent-free. A solvent includes those usable for producing the film-shaped adhesive mentioned above. Also, the viscosity of the adhesive composition can be controlled by amounts of respective components in the adhesive composition.

Electronic Device and Production Method Thereof.

Now, a method for producing an electronic device by using the adhesive composition of the present invention is explained. The method for producing an electronic device is, but not limited to, preferably using the flip chip technique. Since the adhesive composition of the present invention is preferably used as a pre-applied underfill sealant, it is particularly preferable to firstly produce a wafer with an adhesive layer in which the layer of a B-staged adhesive composition is laminated on a wafer, in the production of an electronic device. A method for producing the electronic device of the present invention comprises, for example, (a) a step of laminating an adhesive composition on a wafer to produce a wafer with an adhesive layer; (b) a dicing step of dicing the wafer with the adhesive layer to separate the wafer into semiconductor chips; and (c) a bonding and sealing step of making an electrical connection between a semiconductor chip and a wiring board and sealing their gap.

Hereinafter, each step will be explained.

1. Step for Producing a Wafer with an Adhesive Layer.

In the step for producing a wafer with an adhesive layer, the wafer with the adhesive layer is produced such that a layer of the B-staged adhesive composition is laminated on the element-formed face of the wafer. The wafer with the adhesive layer can be produced depending on the form of the adhesive composition as follows. A backgrind tape may also be laminated on the wafer with the adhesive layer of the present invention.

FIG. 1 shows one example of the step for producing a wafer with an adhesive layer by using a film-shaped adhesive composition. The film-shaped adhesive composition as mentioned above is characterized in that the adhesive composition 11 has been already B-staged on the supporting substrate 12 (FIG. 1(a)). After laminating the film-shaped adhesive composition on the element-formed face of the wafer 13 (FIG. 1(b)), the wafer with the adhesive layer 14 is obtained by cutting the film to fit on wafer's shape (FIG. 1(c)). As another method, the wafer with the adhesive layer may be produced by laminating the film-shaped adhesive composition that has been already cut in the shape of the wafer on the element-formed face of the wafer. As a method for producing the wafer with the adhesive layer equipped with a backgrinding tape, the film-shaped adhesive composition that has already had the backgrinding tape may be used. If the film-shaped adhesive composition has no backgrinding tape, a backgrinding tape may further be laminated on the film-shaped adhesive composition after the adhesive composition is laminated on the wafer.

FIG. 2 shows one example of the step for producing a wafer with an adhesive layer by using a liquid adhesive composition. The liquid adhesive composition is applied on the element-formed face of the wafer 21 by a spin coater (FIG. 2(a)), which is heated to evaporate a solvent to dryness for B-staging the adhesive composition (FIG. 2(b)). Thereby the wafer with the adhesive layer 24 (FIG. 2(c)) can be obtained. A method for applying an adhesive composition includes, but is not limited to, a method of applying by a spin coater, a dispenser, a roll and the like, and a printing method. B-staging in the method may be conducted as the method for producing the film-shaped adhesive composition mentioned above. The backgrinding tape may also be laminated on the B-staged adhesive layer as described above.

2. Dicing Step.

In a dicing step, the above-described wafer with the adhesive layer is separated into semiconductor chips with the adhesive layer in a predetermined size. In the dicing step, the separation can be carried out by dry-type or wet-type dicing by using a common dicing tape and dicing machine. Also, the next-generation dicing method such as laser dicing method and stealth dicing method can be adopted.

FIG. 3 shows one example of the step for producing an electronic device by the flip chip technique by using the wafer with the adhesive layer 34. The wafer with the adhesive layer 34 comprises the adhesive layer 33 laminated on the surface having solder bumps 32 (i.e. the element-formed face) of the wafer 31 (FIG. 3(a)). FIG. 3(b) is one example of the step for dicing the wafer with the adhesive layer 34, which is cut in a predetermined size by the dicing machine 35 to obtain the chip with the adhesive layer 36 (FIG. 3(c)).

3. Bonding and Sealing Step.

In a bonding and sealing step, an electrical connection of a semiconductor element and a wiring board is made, and at the same time, the gap between the semiconductor element and the wiring board is sealed with an adhesive composition, to produce an electronic device. Specifically, a chip with an adhesive layer is placed on a wiring board so that a circuit face of the wiring board and the adhesive layer of the separated chip are face-to-face, and they are aligned and bonded with thermal compression. After thermal compression bonding, they may further be heated for the purpose of completion of curing the adhesive composition. As a method for thermal compression bonding, generally used is a method of completing thermal compression bonding after alignment by using a flip chip bonder, or a method of thermally connecting by a reflow furnace after the alignment and tentative mounting. Herein, a heat profile suitable for packaging and sealing method is employed. For mounting a chip, not only a flip chip bonder but also a machine which is capable of aligning such as a die bonder may be utilized.

While a temperature of thermal compression bonding is not limited in particular, when an electrode is a solder bump or a solder-loaded bump, the temperature is preferably higher by 10° to 100° C. than the melting point of the electrode. The temperature is preferably not less than 200° C., and more preferably 210° to 300° C. A time period of thermal compression bonding is preferably 1 to 20 seconds and its pressure is preferably 0.1 to 7 MPa. In those cases when further heating is conducted to complete curing the adhesive composition after thermal compression bonding, the heating temperature is preferably 150° to 220° C. and the heating time is preferably 30 to 180 minutes. In other cases, heating is not conducted after thermal compression bonding, but is delayed and accomplished during the temperature increases associated with a subsequent solder reflow operation or a molding operation.

FIGS. 3(d) to (f) is a schematic diagram illustrating one example of the bonding and sealing step. An alignment is made between the solder bump 32 of the semiconductor chip with the adhesive layer 36 and the electrode 38 of the wiring board 37 (FIG. 3(d)), and thermal compression bonding is carried out (FIG. 3(e)). Thereby the electronic device is obtained (FIG. 3(f)).

The method for producing the electronic device of the present invention may further comprise the backgrinding step of grinding a face that is opposite to an element-formed face of a wafer (hereinafter, may be referred to as a "wafer backside") by means of a grinder for the purpose of thinning the wafer. The backgrinding step may be carried out anytime before a dicing step and it may be carried out before or after providing a wafer with an adhesive composition. In the backgrinding step, preferably, a backgrinding tape is laminated on an opposite face to the face to be ground.

Here, one example is explained, wherein a backgrinding step is carried out before an adhesive composition is provided on a wafer. First, the backside of a wafer is ground wherein a backgrinding tape is laminated on an element-formed face. Then, a dicing tape is laminated on the wafer backside which has been background, and the backgrinding tape is removed. Subsequently, an adhesive composition is provided on the element-formed face of the wafer, which proceeds on to a dicing step using this wafer with the adhesive layer.

As another method, an example is explained wherein a backgrinding step is carried out after an adhesive composition is provided on a wafer. If the wafer with the adhesive layer has already had a backgrinding tape, the backgrinding may be carried out as it is. On the other hand, if the wafer with the adhesive layer does not have a backgrinding tape, the backgrinding is carried out preferably after a backgrinding tape is laminated on the adhesive layer. After the completion of backgrinding, a dicing tape is laminated on the wafer backside and the backgrinding tape is removed; subsequently, fabrication proceeds on to a dicing step using this wafer.

Besides the method by using the wafer with the adhesive layer described above, an electronic device may also be produced by using a wiring board with an adhesive. The wiring board with the adhesive can be obtained by printing an adhesive composition on a wiring board and B-staging the applied adhesive composition.

FIG. 4 shows one example of the method for producing a wiring board with an adhesive. A liquid adhesive composition 42 is screen-printed on a section where a semiconductor chip is to be mounted on the circuit face of the wiring board 41 (FIG. 4(b)), which is heated for B-staging the adhesive composition. Thereby the wiring board with the adhesive 44 is obtained (FIG. 4(c)).

When an electronic device is produced by using a wiring board with an adhesive, a semiconductor chip is placed on the adhesive formed on the section of a circuit face of a wiring board, which is bonded with thermal compression. The method, condition and the like for thermal compression bonding are as explained in the sealing and bonding step mentioned above.

Since the adhesive composition of the present invention can be provided on an electronic component in the B-staged state beforehand for pre-applied application, it is not necessary to continuously conduct the step of providing an electronic component with an adhesive and the subsequent steps. This allows for foreshortening the steps in a production process of an electronic device. Also, since the adhesive composition of the present invention has a longer pot life in comparison with the conventional ones, it is particularly suitable for the above-described method for producing an electronic component with an adhesive beforehand. Furthermore, the adhesive composition of the present invention has an advantage in that it is possible to bond with thermal compression for a shorter time period in comparison with the case in use of the conventional adhesive composition and in that it is easy to set conditions for thermal compression. There is also an advantage in that, when semiconductor chips are multistacked in an electronic device, these steps of bonding and sealing can be carried out together at once.

EXAMPLES

The present invention is explained with more details based on examples as follows. However, the present invention is not limited by the examples described below.

Table 1 shows the compounds used in the following examples, referential examples and comparative examples.

TABLE 1

| Component | Source name | Explanation of compound |
|---|---|---|
| Radical polymerizable monomer | CD401 | 1,12-dodecanediol dimethacrylate made by Sartomer Co., Inc. |
| | Viscoat802 | Mixture of monopentaerythritol acrylate, dipentaerythritol acrylate, tripentaerythritol acrylate and polypentaerythritol acrylate, made by Osaka Organic Chemical Industry Ltd. |
| | EBECRYL 3701 | Modified epoxy acrylate made by Dicel-Cytec Co., Ltd. |
| | BMI5100 | 3,3'-dimethyl-5,5'-diethyl-4,4'-diphenylmethane bismaleimide made by Daiwa Chemical Industries Co., Ltd. |
| Epoxy monomer | AER260 | Bisphenol A-type epoxy made by Asahi Kasei Co. |
| Polymer | W116.3 | Acrylic rubber, major component: EA, —COOH/—OH introduced as polar group, made by Negami Chemical Industrial Co., Ltd. |
| | Precoat200 | Acrylic rubber, major component: MMA, no polar group, made by Negami Chemical Industrial Co., Ltd. |
| | YP-50EK35 | Phenoxy resin made by Nippon Steel Chemical Co., Ltd. |
| | Acrylic resin 1 | Acrylic resin, Mw: 240,000, acryloyl content: 8% |

TABLE 1-continued

| Component | Source name | Explanation of compound |
|---|---|---|
| | Acrylic resin 2 | Acrylic resin, Mw: 240,000, acryloyl content: 15% |
| | SG-P3 | Acrylic acid ester copolymer, EA-BA-AN, epoxy group introduced, made by Nagase ChemteX Co. |
| Filler | Seahostar KEP10 | SiO2, average particle diameter: 100 nm, made by Nippon Shokubai Co., Ltd. |
| | Seahostar KEP100 | SiO2, average particle diameter: 1 μm, made by Nippon Shokubai Co., Ltd. |
| Silane coupling agent | KBE-9007 | 3-isocyanatopropyltriethoxysilane made by Shin-Etsu Chemical Co., Ltd. |
| Rubber | PNR-1H | Acrylonitrilebutadiene rubber made by JSR Co. |
| | Ricon 130MA13 | Polybutadiene adducted with maleic anhydride, made by Sartomer Co., Inc. |
| Thermal radical initiator | Perbuthyl C | t-Butyl cumyl peroxide made by NOF Co. |
| Epoxy curing agent | Novacure HX-3722 | Latent epoxy curing agent, made by Asahi Kasei Co. |

Preparation of Adhesive Composition

The adhesive compositions prior to B-staging were prepared by mixing respective compounds by the following method. The compounds blended and their contents (% by weight) in each example, referential example and comparative example are as shown in Table 2.

Example 1

Preparation of Mixture A (a Mixture of Radical Polymerizable Monomer, Rubber Component and Filler)

Into a 200 ml disco cup, CD401, Viscoat802 and EBECRYL3701 as radical polymerizable monomers, and RICON130MA13 as a rubber component were taken. This was adjusted to 50° C. and mixed by a spatula. Thereto Seahostar KEP10 as a filler was added and mixed by a spatula to prepare the Mixture A. This mixture A was stored at 50° C. awhile. Subsequently, a roll part of triple rolls was adjusted at 50° C. and the roll gap was adjusted at 10 μm, which were rotated at about 100 rpm. The prepared mixture A was loaded into the triple rolls and was rolled three times, then the roll gap was readjusted at 5 μm and the mixture was rolled twice. The rolled mixture A was weighed.

Preparation of Mixture B (a Mixture of Polymer Content and Solvent)

W116.3 as a polymer component was blended with methyl ethyl ketone as a solvent so that a solid amount becomes from 30 to 20%, which was stirred by a stirrer until complete dissolution to prepare the mixture B.

Preparation of Mixture C (a Mixture of the Mixture A and the Mixture B)

The mixture A rolled and weighed in the above description (1) and an adequate amount of the mixture B were stirred for 30 to 180 minutes at a rate of about 500 rpm to 1,000 rpm by using a stirrer to prepare the mixture C.

Preparation of Adhesive Composition.

Furthermore, the radical reaction initiator PERBUTYL C and the silane coupling agent KBE-9007 were added to the mixture C obtained in the above description (3), which were stirred for 10 minutes at a rate of about 500 rpm to 1,000 rpm by a stirrer to prepare an adhesive composition.

Examples 2 to 7 and 9

The adhesive compositions were prepared as described in Example 1 except that respective components to be blended into the adhesive compositions were changed as in Table 2.

Example 8

The adhesive compositions prior to B-staging were prepared by the following procedure. The proportions (% by weight) of respective compounds blended into the adhesive compositions are as shown in Table 2.

Preparation of Mixture D (a Mixture of Polymer and Solvent)

W116.3 as a polymer was blended with methyl ethyl ketone so that a solid amount becomes 20%, which was stirred by a stirrer until complete dissolution to prepare the mixture D.

Preparation of Mixture E (Addition of Filler)

Seahostar KEP 10 as a filler was added into the mixture D, which was stirred for 2 hours at 3,500 rpm by using a high shear mixer while cooling to prepare the mixture E.

Preparation of Mixture F (Addition of Silane Coupling Agent)

An adequate amount of KBE-9007 was added into the mixture E, which was stirred for 10 minutes at a rate of about 500 rpm to 1,000 rpm by a stirrer to prepare the mixture F.

Preparation of Mixture G (Addition of Radical Polymerizable Monomer and Rubber Component)

Subsequently, into the mixture F, bismaleimide BMI5100 as a radical polymerizable monomer and RICON130MA13 as a rubber component were added, which were stirred for 60 minutes at a rate of about 500 rpm to 1,000 rpm by a stirrer to prepare the mixture G.

Preparation of Adhesive Composition.

PERBUTYL C as a reaction initiator was added to the mixture G, which was stirred for 10 minutes at a rate of about 500 rpm to 1,000 rpm by a stirrer to prepare an adhesive composition.

Referential Example 1

The adhesive composition was prepared as described in Example 1 except that the filler to be blended was replaced with Seahostar KEP100 having an average particle diameter of 1 μm.

Referential Example 2

The adhesive composition was prepared as described in Example 1 so that the proportions of respective constituents are as shown in Table 2 without adding the silane coupling agent and rubber component.

Referential Example 3

The adhesive composition was prepared as described in Example 1 so that the proportions of respective components are as shown in Table 2 without adding the silane coupling agent.

Comparative Example 1

The adhesive composition was prepared as described in Example 1 except that an epoxy monomer and epoxy curing agent is used instead of the radical polymerizable monomer and thermal radical initiator used in Example 1.

Comparative Example 2

The adhesive composition was prepared as described in Example 1 except that Precoat 200 having no polar group was used as a polymer.

Comparative Example 3

The adhesive composition was prepared as described in Example 1 except that the amount of the filler was changed to 5% by weight and the amounts of other components were as shown in Table 2.

B-Staging of Adhesive Composition.

The respective adhesive compositions prepared in the above descriptions were applied in the form of a film on a polyethylene terephthalate film (hereinafter referred to as a "PET film") transparent with a thickness of 100 μm by using a commercially available applicator (made by Kodaira Seisakusho Co. Ltd., Baker Applicator YBA). This was heated for 10 minutes at 90° C. in an oven for B-staging the adhesive composition. The thickness of the resultant film was measured by a microgauge to produce the film-shaped adhesive composition B-staged with a thickness of 60 μm. There were used for testing. The testing method is shown as follows.

Testing Method.

Transparency.

An evaluation was made whether a letter of 12 font can be read or not under a PET film laminated with a B-staged adhesive composition. An evaluation criterion is as follows.

(1) OK: The above-described letter can be read.

(2) NG: The above-described letter cannot be read.

Work Life.

First, a temperature at the onset of exotherm and a temperature at the maximum of exotherm for the B-staged adhesive composition were measured by the differential scanning calorimetry (hereinafter, DSC, condition; from 30° C. to 400° C. at 10° C./min.). Subsequently, the B-staged adhesive composition was left for 3 days at 45° C. and again subjected to the DSC to measure a temperature at the onset of exotherm and a temperature at the maximum of exotherm. An evaluation criterion is as follows.

(1) OK: The variations of both a temperature at the onset of exotherm and a temperature at the maximum of exotherm after being left from the temperatures before being left are within ±5° C.

(2) NG: The variation(s) of a temperature at the onset of exotherm and/or a temperature at the maximum of exotherm after being left from the temperature(s) before being left exceed(s) ±5° C.

Gel Time.

A B-staged adhesive composition was laminated at 50° C. on a silicon substrate with 7 mm squares. A hot plate face was protected with aluminum foil and adjusted at 230° C. The adhesive face of the silicon substrate was pressed onto the hot plate face protected with aluminum foil, and the silicon substrate was nudged with being pushed until it did not move by adhesion. The lapse time until the silicon substrate became immovable was determined as a gel time.

Elastic Modulus and Linear Expansion Coefficient.

A B-staged adhesive composition films were laminated while removing a PET film so that their thickness was 500 μm to 10,000 μm, which was cut by a utility knife in a width of 10 mm and a length of 60 mm. A B-staged adhesive composition formed in this way was heated at 200° C. for 2 hours in an oven. After allowing the composition to come back to room temperature, its shape was sculpted with abrasive paper, and its elastic modulus and linear expansion coefficient were measured by DMS6100 made by Seiko Instruments Inc. Regarding the linear expansion coefficient, α1 was the linear expansion coefficient at or below a glass transition temperature (Tg), and α2 was the linear expansion coefficient at or above Tg.

Die Shear A.

A B-staged adhesive composition was laminated at 50° C. on a SiN substrate with 2 mm squares. This was pressed at 1 N/200° C. onto a substrate of a printed-wiring board FR-5 grade for temporary adhesion. After the temporary adhesion, it was cured at 180° C. for 1 hour, and subsequently it was stored for 48 hours under a condition of 85° C. and 85% humidity. After cooling down to room temperature, an extent of force of breaking the adhesion material was measured by Bondtester Series 4000 made by DEGA Co.

Die Shear B.

A measurement is carried out as the above-described measurement of die shear A except that a SiN substrate was used instead of the FR-5 grade.

TABLE 2

Blending content of compounds in each adhesive composition.

| Content | Source name | Example 1 | 2 | 3 | 4 | 5 | 6 | 7 | 8 | 9 | Referential example 1 | 2 | 3 | Comparative example 1 | 2 | 3 |
|---|---|---|---|---|---|---|---|---|---|---|---|---|---|---|---|---|
| Radical polymerizable monomer | CD 401 | 12 | 11 | 12 | 12 | 14 | 14 | 14 | | 12 | 12 | 15 | 12 | | 12 | 23 |
| | Viscoat 802 | 12 | | 13 | 12 | 14 | 14 | 14 | | 12 | 12 | 15 | 13 | | 12 | 24 |
| | EBECRYL 3701 | 12 | 11 | 13 | 12 | 13 | 13 | 13 | | 12 | 12 | 14 | 12 | | 12 | 24 |
| | BMI 5100 | | 11 | | | | | | 33 | | | | | | | |
| Epoxy monomer | AER 260 | | | | | | | | | | | | | 40 | | |
| Polymer | W116.3 | 15 | 15 | 15 | | 15 | 7 | 7 | 15 | | 15 | 15 | 15 | 15 | | 15 |
| | Precoat 200 | | | | | | | | | | | | | | 15 | |
| | YP-50EK35 | | | | 15 | | | | | | | | | | | |
| | Acrylic resin 1 | | | | | | 8 | | | | | | | | | |
| | Acrylic resin 2 | | | | | | | 8 | | | | | | | | |
| | SG-P3 | | | | | | | | | 10 | | | | | | |
| Filler | Seahostar KEP10 | 40 | 40 | 45 | 40 | 40 | 40 | 40 | 40 | 45 | | 40 | 40 | 40 | 40 | 5 |
| | Seahostar KEP100 | | | | | | | | | | 40 | | | | | |
| Silane coupling agent | KBE-9007 | 1 | 1 | 1 | 1 | 1 | 1 | 1 | 1 | 1 | 1 | | | 1 | 1 | 1 |
| Rubber | PNR-1H | | | | | 2 | 2 | 2 | | | | | | | | |
| | Ricon130MA13 | 7 | 10 | | 7 | | | | 10 | 7 | 7 | | 7 | 4 | 7 | 7 |
| Reaction initiator | PERBUTYL C | 1 | 1 | 1 | 1 | 1 | 1 | 1 | 1 | 1 | 1 | 1 | 1 | | 1 | 1 |
| Epoxy curing agent | NOVACUREH X-3722 | | | | | | | | | | | | | 5 | | |
| | Total | 100 | 100 | 100 | 100 | 100 | 100 | 100 | 100 | 100 | 100 | 100 | 100 | 100 | 100 | 100 |

(Unit of value: % by weight)

TABLE 3

| | Example 1 | 2 | 3 | 4 | 5 | 6 | 7 | 8 | 9 | Referential 1 | 2 | 3 | Comparative 1 | 2 | 3 |
|---|---|---|---|---|---|---|---|---|---|---|---|---|---|---|---|
| Transparency | OK | OK | OK | OK | OK | OK | OK | OK | OK | NG | OK | OK | OK | OK | OK |
| Work life | OK | OK | OK | OK | OK | OK | OK | OK | OK | OK | OK | OK | NG | OK | OK |
| Gel time (Second) | <5 | <5 | <5 | <5 | <5 | ND | ND | ND | <5 | <5 | <5 | <5 | 11 | <5 | <5 |
| Elastic modulus (GPa) | 5.5 | 4.9 | 4 | 3.1 | 4.6 | 5.3 | 6.1 | 4.3 | 4.3 | 6.6 | 3.2 | 3.7 | 6.1 | 1 | 3.7 |
| Linear expansion coefficient ($\alpha 1$) ($\times 10^{-6}/°C$) | 35 | 32 | 29 | 33 | 30 | ND | ND | 26 | 30 | 30 | 26 | ND | 30 | 32 | 113 |
| Linear expansion coefficient ($\alpha 2$) ($\times 10^{-6}/°C$) | 79 | 66 | 64 | 80 | 75 | ND | ND | 59 | 70 | 73 | 68 | ND | 67 | 89 | 357 |
| Die shear A (N/mm2) | 22 | 20 | 19 | 14 | 21 | ND | ND | 16 | 21 | 19 | 7 | 11 | 26 | 11 | 24 |
| Die shear B (N/mm2) | 24 | ND | ND | ND | ND | ND | ND | ND | ND | ND | 17 | 22 | ND | ND | ND |

(ND: No data)

While the filler with an average particle diameter of 1 μm was blended in the adhesive composition of the referential example 1, the resultant adhesive film had low transparency. This showed that a finer filler is needed to be used for an application in which the transparency of an adhesive is required.

Neither silane coupling agent nor rubber was blended in the adhesive composition of the referential example 2, and no silane coupling agent was blended in the adhesive composition of the referential example 3. The adhesives obtained from these adhesive compositions had low die shear A. This showed that a silane coupling agent and/or rubber are/is needed to be blended to improve the die shear force of an adhesive depending on an adhered object.

While the adhesive composition of the comparative example 1 comprises an epoxy monomer, its gel time was long and its work life was not good. That is to say, it was shown that longer time for curing is required and stability is also lower compared to the use of a radical polymerizable monomer.

While Precoat 200 having no polar group was blended as a polymer in the adhesive composition of the comparative example 2, an elastic modulus was low.

While the adhesive composition of the comparative example 3 had a content rate reduced to 5% of the filler, coefficient of linear expansion is high. Thus, the composition is unsuitable for the underfill application.

Explanation of Numerical Signs
11 Film-shaped adhesive composition
12 Supporting substrate
13 Wafer
14 Wafer with an adhesive layer
21 Wafer
22 Liquid adhesive composition
23 Wafer on which an adhesive composition has been applied
24 Wafer with an adhesive layer
31 Wafer
32 Solder bump
33 Adhesive layer
34 Wafer with an adhesive layer
35 Dicing machine
36 Chip with an adhesive layer
37 Wiring board
38 Electrode
39 Heating stage
40 Electronic device
41 Wiring board
42 Applied adhesive composition
43 B-staged Adhesive composition
44 Wiring board with an adhesive

The invention claimed is:

1. An adhesive composition for a pre-applied underfill sealant comprising:
   (a) a radical polymerizable monomer having one or more functional groups selected from the group consisting of vinyl group, maleimide group, acryloyl group, methacryloyl group and allyl group,
   (b) a polymer having a polar group, wherein the polar group is selected from the group consisting of hydroxyl, carboxyl, (meth)acrylovl and epoxy group, and the polymer has a weight-average molecular weight in the range of 10,000 to 1,000,000,
   (c) a filler having an average particle diameter of less than 1 μm, and
   (d) a thermal radical initiator,
wherein the adhesive composition is in the form of a film having a thickness not less than 5 μm and not more than 100 μm.

2. The adhesive composition according to claim 1, wherein said thermal radical initiator (d) is an organic peroxide.

3. The adhesive composition according to claim 1, further comprising a support tape laminated on the adhesive composition.

4. A method for producing a film-shaped adhesive composition, comprising a step of applying the adhesive composition according to claim 1 on a supporting substrate, and B-staging the applied adhesive composition.

5. A wafer with an adhesive layer, comprising the adhesive composition according to claim 1 in a B-staged state and laminated on an element-formed face of a wafer.

6. The wafer with an adhesive layer according to claim 5, further comprising a support tape laminated on the adhesive layer.

7. A method for producing a wafer with an adhesive layer, comprising a step of applying the adhesive composition according to claim 1 on an element-formed face of a wafer, and B-staging the applied adhesive composition.

8. A method for producing a wafer with an adhesive layer, comprising a step of laminating the film-shaped adhesive composition according to claim 1 on an element-formed face of a wafer.

9. A wiring board with an adhesive, comprising the adhesive composition according to claim 1 in a B-staged state and laminated on a wiring board.

10. A method for producing a wiring board with an adhesive, comprising a step of applying the adhesive composition according to claim 1 on a wiring board, and B-staging the applied adhesive composition.

11. An electronic device which is produced by using the adhesive composition according to claim 1.

* * * * *